United States Patent
Chirovsky et al.

(10) Patent No.: US 6,208,680 B1
(45) Date of Patent: Mar. 27, 2001

(54) OPTICAL DEVICES HAVING ZNS/CA-MG-FLUORIDE MULTI-LAYERED MIRRORS

(75) Inventors: Leo Maria Chirovsky, Bridgewater; Sanghee Park Hui, New Providence; George John Zydzik, Columbia, all of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 08/997,711

(22) Filed: Dec. 23, 1997

(51) Int. Cl.$^7$ ...................................... H01S 5/187
(52) U.S. Cl. .................. 372/96; 372/46; 372/92; 359/359
(58) Field of Search .................... 372/45, 46, 50, 372/96, 92, 108; 359/359

(56) References Cited

U.S. PATENT DOCUMENTS

| | | | |
|---|---|---|---|
| H137 | * 10/1986 | Briggs et al. | 75/398 |
| 4,819,039 | 4/1989 | Chi et al. | |
| 5,206,871 | 4/1993 | Deppe et al. | 372/45 |
| 5,339,326 | * 8/1994 | Tsujimura et al. | 372/49 |

OTHER PUBLICATIONS

E. M. Levin et al., *Phase Diagrams for Chemists*, M. K. Reser, Editor, The American Ceramic Society, p. 430 (1964) (No Month).

* cited by examiner

Primary Examiner—Rodney Bovernick
Assistant Examiner—Michael J. Stahl
(74) Attorney, Agent, or Firm—Michael J. Urbano

(57) ABSTRACT

In a multi-layered dielectric mirror the higher refractive index layers comprise ZnS and the lower refractive index layers comprise a composite of approximately 95%MgF$_2$ and 5%CaF$_2$ by mole fraction. In one embodiment, the fluoride layers are e-beam deposited from an essentially eutectic melt of the two fluorides. In another embodiment, the semiconductor surface on which the mirror is formed is protected by an aluminum borosilicate glass layer. Application of the invention to the design and fabrication of VCSELs is also described.

22 Claims, 1 Drawing Sheet

OPTICAL DEVICES HAVING ZNS/CA-MG-FLUORIDE MULTI-LAYERED MIRRORS

CROSS-REFERENCE TO RELATED APPLICATIONS

This application was concurrently filed with application Ser. No. 08/977,710 entitled Vertical Cavity Surface-Emitting Laser with separate Optical and Current Guides and application Ser. No. 08/997,712 entitled Lateral Injection VCSEL now U.S. Pat. No. 6,044,100.

FIELD OF THE INVENTION

This invention relates generally to optical devices having at least one dielectric mirror and, more particularly, to vertical cavity surface-emitting lasers (VCSELs) having at least one multi-layered mirror (MLM) made of dielectric materials.

BACKGROUND OF THE INVENTION

MLMs are commonly employed in optical devices to obtain high reflectivity at a free-space operating wavelength $\lambda$. In VCSELs, for example MLMs may comprise dielectric (i.e., non-semiconductor) materials as shown in FIG. 1, or one MLM may comprise dielectric materials and the other semiconductor materials as shown in FIG. 2. In either case, an MLM comprises a plurality of pairs of quarter-wavelength thick layers, each pair comprising a relatively high refractive index ($n_H$) layer adjacent a relatively lower refractive index ($n_L$) layer. Depending on the refractive index difference between these layers, just a few pairs of layers can yield reflectivities greater than 90% over a wavelength range $\Delta\lambda$ of several hundred nanometers. The reflectivity, R, and the spectral width, $\Delta\lambda/\lambda$, of the MLM are given by equations (1) and (2), respectively:

$$R = \tan h^2[0.5 \ln (n_B/n_M) + N \ln (n_H/n_L)] \quad (1)$$

$$\Delta\lambda/\lambda = (4/\pi) \sin^{-1}[(n_H - n_L)/(n_H + n_L)] \quad (2)$$

where N is the number of pairs of layers in the MLM. In addition, the MLM is assumed to be disposed between a body having a refractive index $n_B$ and a medium having a refractive index $n_M$. Illustratively, the medium is air, an index-matching epoxy or an optical fiber. into which the output beam of the VCSEL is coupled. Equations (1) and (2) also assume that inequality (3) is satisfied:

$$n_B \geq n_H > n_L \geq n_M \quad (3)$$

and that the order of the pairs is such that the lower index layer of the first pair contacts the body and the higher index layer of the last pair contacts the medium. The set of equations for other cases can readily be derived from the above by those skilled in the art.

Several combinations of dielectric mirrors are well known for use in MLMs, with the choice for a particular application often being based on one or more of the following criteria: (1) ease and uniformity of deposition, (2) environmental safety, (3) reflectivity and spectral width, and (4) reproducibility. One combination of materials known in the prior art utilizes ZnS as the higher refractive index layer ($n_H$=2.30) and a fluoride (e.g. $CaF_2$ or $MgF_2$) as the lower refractive index material ($n_L$ =1.38). Theoretically an MLM made of only six to eight pairs of these layers could produce extremely high reflectivities of 99.5% to 99.9% at $\lambda$=0.7–1.5 $\mu$m, making such MLMs very attractive for use with many VCSELs; e.g., GaAs/AlGaAs VCSELs as well as InGaAs/GaAs VCSELs. In practice, however, we have found that several problems are encountered with either $ZnS/MgF_2$ or $ZnS/CaF_2$ MLMs: high light-scattering losses or serious patterning difficulties.

Light scattering is attributable to non-smooth layer surfaces or to small amounts of crystallization in the otherwise amorphous dielectric materials. Just a fraction of a percent loss of reflectivity due to such scattering may be intolerable in some VCSEL designs, and cannot be compensated by including additional pairs of layers in the MLM. On the other hand, patterning difficulties arise because the fluorides and ZnS have different chemical properties, making it difficult to etch the MLMs controllably. Of course, MLMs which cannot be controllably patterned are impractical for optical devices such as VCSELs because they would inhibit or prevent the formation of electrical contacts to the underlying material of the laser (e.g., the semiconductor material of a VCSEL).

SUMMARY OF THE INVENTION

In an effort to address these problems, we developed a liftoff technique for patterning dielectric MLMs, but encountered the following dilemma. The technique allowed us to pattern $CaF_2/ZnS$ MLMs, but the mirrors exhibited significant light-scattering loss. In contrast $MgF_2/ZnS$ MLMs had relatively low scattering losses but were not mechanically robust enough for reproducible liftoff (e.g., the layers often peeled off one another during the process).

In accordance with one aspect of our invention, we discovered that the effect of both problems can be significantly alleviated by the use of a composite Ca—Mg fluoride for the lower index layers and ZnS for the higher index layers. Preferably the fluoride layers have approximately 95% $MgF_2$ and 5% $CaF_2$ by mole fraction. In accordance with another aspect of our invention, a dielectric MLM is fabricated by e-beam depositing alternating layers of ZnS and a Ca—Mg-fluoride composite, the fluoride layers being preferably e-beam deposited from a source which comprises essentially a eutectic mixture (e.g., melt) of $CaF_2$ and $MgF_2$.

In accordance with another aspect of our invention, when a semiconductor surface (especially an optically smooth Group III–V compound surface) is subjected to processing steps which might adversely affect it (e.g. as in the formation of a dielectric MLM thereon), the surface is protected by a glass layer before any such steps are performed. In a preferred embodiment, the protective glass layer comprises an aluminum borosilicate glass.

BRIEF DESCRIPTION OF THE DRAWINGS

Our invention, together with its various features and advantages, can be readily understood from the following more detailed description taken in conjunction with the accompanying drawings, in which.

In the interest of clarity and simplicity, the figures have not been drawn to scale. In addition, when describing physical or optical dimensions, the symbol A stands for Angstroms, whereas when describing electric current, it stands for Amperes.

DETAILED DESCRIPTION OF THE INVENTION

The following exposition will focus on the application of our invention to VCSELs with the understanding that the invention can readily be used with other optical devices. In addition, although the description addresses the structure and fabrication of a single VCSEL, the principles apply equally to arrays of VCSFLs.

Figure 1:
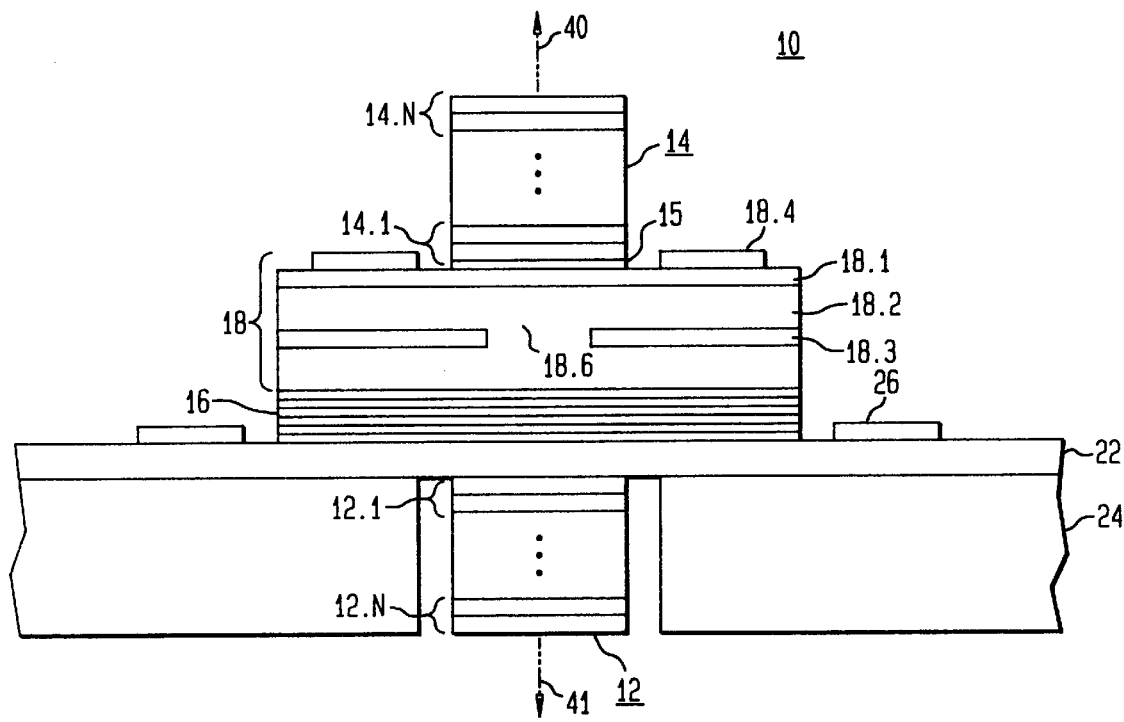
FIG. 1 is a schematic, cross-sectional view of a VCSEL in accordance with one embodiment of our invention in which both of the cavity resonator mirrors comprise deposited ZnS/Ca—Mg-fluoride MLMs.

With reference now to FIG. 1, a VCSEL 10 in accordance with one aspect of our invention comprises first and second MLMs 12 and 14, respectively, forming an optical cavity resonator with its axis perpendicular to the layers. An active region 16 is disposed within the resonator and is oriented perpendicular to its axis. When suitably pumped, the active region generates stimulated emission of radiation (at a free-space center wavelength λ) which propagates along the resonator axis and emerges from the resonator through one of the mirrors (e.g., second mirror 14) as an output signal 40, or through both mirrors as output signals 40 and 41. Typically, the active region is electrically pumped by means of a current guide 18 which includes a current confinement aperture 18.6.

The current guide 18 comprises a relatively high conductivity, contact-facilitating layer 18.1, an annular first electrode 18.4 formed on layer 18.1, a lower conductivity layer 18.2 beneath layer 18.1, and a high resistivity (e.g., ion-implanted) region or zone 18.3 formed in the layer 18.2. Region 18.3 typically has an annular shape, the central opening of which forms the current confinement aperture 18.6. Current flows from the first electrode 18.4, through the aperture 18.6, through the active region 16, and to second annular electrode 26 (via a high conductivity cutrent return layer 22 disposed between the active region 16 and the first mirror 12).

Figure 2:
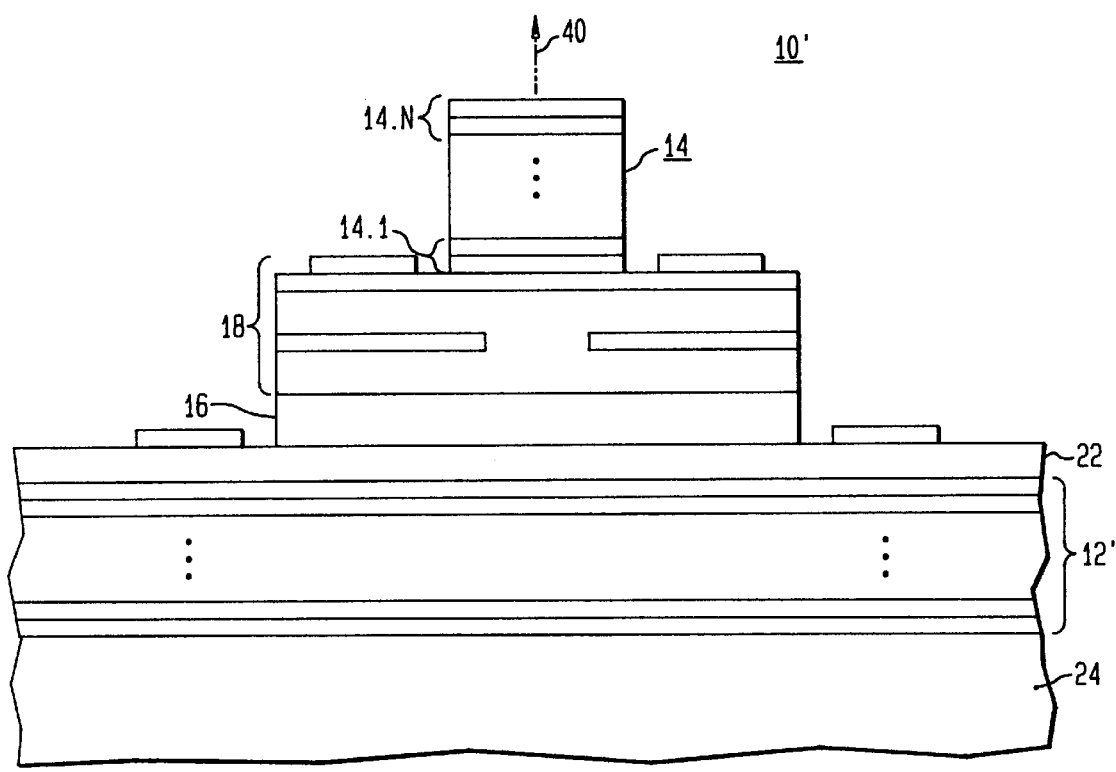
FIG. 2 is a schematic, cross-sectional view of a VCSEL in accordance with another embodiment of our invention in which one of the cavity resonator mirrors comprises a deposited ZnS/Ca—Mg-fluoride MLM and the other comprises an epitaxially grown semiconductor MLM.

In FIG. 1 both mirrors 12 and 14 are dielectric MLMs, with the upper MLM 14 being deposited on the guide 18 and lower MLM 12 being deposited on the portion of layer 22 exposed by an opening in substrate 24. Alternatively, the substrate 24 could be entirely removed before the lower mirror 12 is deposited. In FIG. 2 the upper mirror 14 is similarly a dielectric MLM deposited on guide 18, whereas lower mirror 12' is a semiconductor MLM epitaxially grown substrate 24. Each MLM 12,14 comprises a plurality of N pairs of quarter-wavelength thick dielectric layers 12.1 . . . 12.N and 14.1 . . . 14.N, each pair comprising a relatively high refractive index layer and a lower refractive index layer. However, the number N of pairs in the various MLMs need not be the same. In addition, in the embodiment of FIG. 1, one or more pairs of one of the dielectric mirrors could be replaced with a high reflectivity metal (e.g.. Au or Ag) coating, thus forcing the output signal to emanate only from the other mirror. The metal coating may also serve to reduce the topological profile of the device.

The reflectivity and spectral width of the MLMs 12, 12' and 14 are given by equations (1) and (2), and each satisfies inequality (3). With respect to the latter, the lower refractive index layer of he first pair 14.1 of MLM 14 (in both FIGS. 1 and 2) contacts layer 18.1 (or protective glass layer 15, discussed infra), whereas the lower refractive index layer of the first pair 12.1 of MLM 12 contacts layer 22 (or, as above, a protective glass layer, not shown). Thus, layer 15 may be viewed as part of the adjacent mirror, and layers 18.1 and 22 may be viewed as the body having a refractive index $n_B$ alluded to earlier. Layers 18.1 and 22 may comprise the same material or different materials. On the other hand, the higher refractive index layers of the last pairs 12.N,14.N of MLMs 12,14, respectively, are shown as contacting an air medium ($n_M$=1), but in some applications the output coupling scheme could place different media (e.g.. index matching epoxy) in contact with the outermost layer of pair 12.N or 14.N, or both.

In accordance with one aspect of our invention, the MLMs 12 and 14 comprise alternating pairs of quarter-wavelength thick layers, each pair including a relatively high refractive index layer of ZnS ($n_H$=2.30) and a lower refractive index layer of a composite of $CaF_2$ and $MgF_2$. Preferably, each lower refractive index layer comprises approximately 95% $MgF_2$ and 5% $CaF_2$ by mole fraction, resulting in a layer having $n_L$=1.38. Importantly, we have found that this combination of layers exhibits low scattering loss and can be controllably patterned. In accordance with another aspect of our invention, the composite fluoride layers are e-beam deposited from a source which comprises an essentially eutectic mixture (e.g., melt) of the two fluoride constituents; i.e., approximately 47% $MgF_2$ and 53% $CaF_2$ by weight or, equivalently, approximately 53% $MgF_2$ and 47% $CaF_2$ by mole fraction.

In accordance with another aspect of our invention, when a semiconductor surface (especially an optically smooth Group III–V compound surface) is subjected to processing steps which might adversely affect it, the surface is first protected by a thin glass layer before any such steps are performed. Illustrative of such steps are exposure to PR developer during the mirror fabrication and exposure to chemicals during cleaning steps. Preferably, the glass layer comprises an aluminum borosilicate glass layer about 50–100 A thick. This layer may be e-beam evaporated from a source of 1% $Al_2O_3$, 3% $B_2O_3$ and 96% $SiO_2$ by weight which is commercially available from Corning Glassworks, Inc., Corning, N.Y. under the trademark VYCOR.

The active region 16 is disposed between the current guide 18 and the current return layer 22. The active region may be a single layer, but is preferably a well-known multi-quantum well (MQW) region comprising alternating layers of different bandgap; e.g., GaAs quantum well layers interleaved with AlGaAs barrier layers for operation at a center wavelength of about 0.85 μm. For operation at other center wavelengths, the active region would be made of different semiconductor materials such as InP and InGaAsP (e.g., for operation at 1.3 μm or 1.5 μm). Similarly, for operation at 0.98 μm the MQW active region could be made of InGaAs and GaAs, or of InGaAs and GaAsP.

Electrodes 26 and 18.4 on the VCSEL are preferably annular contacts located on the same side of the laser, as shown, to facilitate applications such as flip-chip bonding of the laser to another chip or a circuit board. However, for other applications the contact 26 could instead be a broad area contact or an annular contact located on the bottom of substrate 24. The term substrate as used herein means any support member on which other layers of the laser or other optical device are formed. For example, it might be a single crystal body on which epitaxial layers are grown, or it might be a combination of such a substrate and an epitaxial buffer layer.

After the electrodes are deposited, a liftoff technique is use to pattern the dielectric mirror 14. More specifically, a layer of photoresist (PR) is deposited on top of the wafer. The thickness of the PR should be greater than the intended height of the mirror 14. A re-entrant opening is formed in the PR. Illustratively, the re-entrant opening has a trapezoidal cross-section with the top of the trapezoid corresponding to the top of the opening. The dielectric mirror is then deposited in the opening and on top of the PR. Lastly, the PR is lifted off by suitable etching, leaving the desired dielectric mirror on the top of the VCSEL.

Although a number of epitaxial growth techniques may be used to form the various semiconductor layers of the VCSEL, molecular beam epitaxy (MBE) and metalorganic chemical vapor deposition (MOCVD) are both well suited to the thickness control required for many of the extremely thin layers; e.g. the layers of mirror 12' and MQW active region 16. On the other hand, the dielectric (non-epitaxial) layers of mirrors 12 and 14 are typically formed by e-beam deposition from single crystal sources under conditions which avoid crystalline devitrification. See, for example, U.S. Pat. No. 5,206,871, granted to D. G. Deppe et al. on Apr. 27, 1993, which is incorporated herein by reference. Other techniques, such as sputtering or plasma deposition, may also be suitable.

EXAMPLE

The following example describes the fabrication of a VCSEL of the type depicted in the FIG. 2. Although the fabrication of a single device is described, it will be understood, of course, that typically an array of devices is formed on a single wafer. The various material, dimensions, and other parameters are provided by way of illustration only, and unless otherwise expressly indicated are not intended to limit the scope of the invention. MBE and MOCVD were used to grow all of the semiconductor layers. The term undoped epitaxial layer as used herein generally means that the layer was not intentionally doped, but may have been subject to low level doping from background dopants in the growth chamber. In addition, when describing physical or optical dimensions, the symbol A stands for Angstroms, whereas when describing electric current, it stands for Amperes.

The VCSEL 10' was designed for operation at a free-space center wavelength of about 0.98 $\mu$m, a threshold current of about 1 mA an operating current of about 3–5 mA, and a power dissipation of about 5–10 mW. To this end the laser comprised: an $n^+$-doped single crystal GaAs substrate 24 obtained from commercial sources; a DBR mirror 12' comprising 28 pairs of $n^+$-doped GaAs/AlAs layers each doped with Si to about $3\times10^{18}$ cm$^{-3}$ and about 696 A/829 A thick, respectively; an n-type GaAs current return layer 22 doped with Si to about $1\times10^{18}$ cm$^{-3}$; an MQW active region 16 comprising 3 pairs of undoped $In_{0.2}Ga_{0.8}As$/GaAs layer pairs, each layer being about 80 A thick; a $\pi$-type GaAs layer 18.2 about 3000 A thick and doped with Be to about $5\times10^{17}$ cm$^{-3}$; a region 18.3 implanted with fluorine ions (at 100 keV and a dose of $4\times10^{12}$ cm$^{-2}$) to a depth of about 0.1–0.2 $\mu$m below the top of layer 18.1 and forming a circular current aperture 18.6 about 6 $\mu$m in diameter or 10 $\mu$m in diameter; and a $p^{++}$-type GaAs layer 18.1 about 300 A thick and doped with C to about $10^{20}$ cm$^{-3}$.

In order to remove shallow traps in layers 18.1 and 18.2, the structure was annealed at about 500° C. for about 20 min.

The two electrodes, both in the form of an annulus, were deposited by conventional e-beam evaporation techniques to form the electrode 18.4 as a p-type ohmic contact and the electrode 26 as an n-type ohmic contact.

After the electrodes were deposited, an aluminum borosilicate glass protective layer 15 was deposited on the semiconductor surface on which dielectric mirror 14 was to be subsequently formed in order to protect the surface from attack by the PR developer described below. The protective layer 15, which was about 80 A thick and had a refractive index of about 1.47, was e-beam deposited from a source comprising approximately 1% $Al_2O_3$, 3% $B_2O_3$ and 96% $SiO_2$. Then, the dielectric mirror 14 was deposited by e-beam evaporation and patterned by a lift-off technique as follows.

A negative tone PR (i.e., NR8-3000 PR obtained from Futurrex Inc., Franklin, N.J.) was spun on at 3000 rpm on the top of the wafer. The PR was then soft baked at 130° C. for 1 min. on a hot plate. Light at a wavelength of 385 nm and an energy of 150 mJ was directed at the PR through a suitable shadow mask. As with standard photolithography, only the region where an opening was to be formed (and a mirror was to be deposited) was so exposed. Then the PR was soaked for 10 min. in an aqueous alkaline RD2 developer. As a result, a re-entrant, trapezoidal opening about 6 $\mu$m wide at the top (10 $\mu$m wide in other cases) with about 1 $\mu$m of undercut was formed in the PR. The opening was cleaned in an oxygen plasma for 2 min. at 250 mTorr and 50 W. Then, the dielectric mirror 14 was deposited as described below.

The mirror 14 comprised 6 pairs of layers, each pair including a $MgF_2$—$CaF_2$ layer having a refractive index of 1.38 and a thickness of about 1775 A and a ZnS layer having a refractive index of 2.30 and a thickness of about 1065 A. To avoid crystalline devitrification the former layers were e-beam deposited in a vacuum chamber at a pressure of $1\times10^{-6}$ to $5\times10^{-6}$ Torr and at a substrate temperature of 50–80° C. Deposition took place from single crystal eutectic source (i.e. melt) of about 47% $MgF_2$ and 53% $CaF_2$ by weight or, equivalently, 53% $MgF_2$ and 47% $CaF_2$ by mole fraction. To remove water from all surfaces of the chamber and the substrate, the substrate was heated to above 100° C. (e.g., to 108° C.) for about 15 min. before being lowered to the deposition temperature (e.g., 62° C.).

After the mirror was deposited, lift-off of the PR was performed by soaking in boiling acetone for 2 min. Residual flakes of PR were removed with an acetone spray.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, although not shown, the VCSELs may include an optical guide in order to confine the transverse modes of the lasing radiation. As described in concurrently filed application, Ser. No. 08/997,710, supra, an optical guide illustratively includes an relatively high refractive index mesa disposed in the cavity resonator and transverse to the resonator axis. When such a mesa is used in conjunction with an overlying dielectric mirror, the protective layer 15 is deposited on the top surface of the mesa for the reasons discussed above. In this manner, the optical smoothness and thickness of the mesa surface are preserved.

In addition, the well known technique of delta-doping may be utilized to dope any of the semiconductor layers, especially those which have high levels of carrier concentration (e.g., layers 18.1 and 22).

What is claimed is:

1. An optical device comprising
   a multi-layered dielectric mirror for reflecting radiation at a center wavelength, said mirror including a plurality of pairs of essentially quarter-wavelength thick dielectric layers, each pair comprising a relatively high refractive index layer and a lower refractive index layer, characterized in that said high refractive index layer comprises ZnS, and said lower refractive index layer comprises a composite of $CaF_2$ and $MgF_2$, and said device includes a semiconductor surface and a glass layer disposed on said surface, said mirror being disposed on said glass layer.

2. The invention of claim 1 wherein said glass layer comprises an aluminum borosilicate glass.

3. The invention of claim 2 wherein said surface comprises a Group III–V compound surface.

4. The invention of claim 1 wherein said lower refractive index layer comprises approximately 95% $MgF_2$ and 5% $CaF_2$ by mole fraction.

5. A laser for generating radiation at a center wavelength comprising a cavity resonator formed by at least a first multi-layered mirror, said first mirror including a plurality of pairs of essentially quarter-wavelength thick dielectric layers, each pair comprising a relatively high refractive index layer and a lower refractive index layer, and an active medium disposed within said resonator for generating said radiation when suitably pumped, characterized in that said high refractive index layer comprises ZnS, and said lower refractive index layer comprises a composite of approximately 95% $MgF_2$ and 5% CaF glass by mole fraction.

6. The invention of claim 5 including a semiconductor surface and a glass layer disposed on said surface, and wherein said mirror is disposed on said glass layer.

7. The invention of claim 6 wherein said glass layer comprises an aluminum borosilicate glass.

8. The invention of claim 7 wherein said surface comprises a Group III–V compound surface.

9. The invention of claim 5 wherein said resonator includes a second multi layered mirror.

10. The invention of claim 9 wherein said second mirror also includes a plurality of pairs of essentially quarter-wavelength thick dielectric layers, each pair comprising a relatively high refractive index layer and a lower refractive index layer, and wherein said high refractive index layer comprises ZnS, and said lower refractive index layer comprises a composite of approximately 95% $MgF_2$ and 5% $CaF_2$ by mole fraction.

11. The invention of claim 10 including a semiconductor surface and a glass layer disposed on said surface, and wherein said second mirror is disposed on said glass layer.

12. The invention of claim 11 wherein said glass layer comprises an aluminum borosilicate glass.

13. The invention of claim 12 wherein said surface comprises a Group III–V compound surface.

14. The invention of claim 9 wherein said second mirror includes a plurality of pairs of essentially quarter-wavelength thick semiconductor layers, each pair comprising a relatively high refractive index semiconductor layer and a lower refractive index semiconductor layer.

15. A VCSEL for generating radiation at a center wavelength comprising a pair of multi-layered mirrors forming a cavity resonator having a resonator axis perpendicular to said layers, each of said mirrors comprising a plurality of pairs of essentially quarter-wavelength thick layers, each pair comprising a relatively high refractive index layer and a lower refractive index layer, and in at least one of said mirrors said high refractive index layers comprise ZnS and said lower refractive index layers comprise a composite of approximately 95% $MgF_2$ and 5%CaF glass by mole fraction, an active region disposed within said resonator for generating said radiation when suitably pumped, and current guide means for directing pump current through a current aperture to said active region to generate said radiation which propagates along said axis, a portion of said radiation forming an output signal which emerges through at least one of said mirrors.

16. The invention of claim 15 including a semiconductor surface and a glass layer disposed on said surface, and wherein one of said mirrors is disposed on said glass layer.

17. The invention of claim 16 wherein said glass layer comprises an alumninum borosilicate glass.

18. The invention of claim 17 wherein said surface comprises a Group III–V compound surface.

19. A method of fabricating a multi-layered dielectric mirror for reflecting radiation at a center wavelength comprising the steps of depositing a plurality of pairs of essentially quarter-wavelength thick layers on a substrate, each pair comprising a relatively high refractive index layer and a lower refractive index layer, characterized in that said high refractive index layers are deposited as ZnS, and said lower refractive index layers are deposited by e-beam evaporation as a composite of approximately 95% $MgF_2$ and 5% $CaF_2$ by mole fraction from a source which comprises a eutectic melt of approximately 53% MgF glass and 47% $CaF_2$ by mole fraction.

20. The invention of claim 19 including the step of depositing a glass layer on a semiconductor surface and forming said mirror on said glass layer.

21. The invention of claim 20 wherein said glass layer is e-beam evaporated from a source which comprises aluminum borosilicate.

22. The invention of claim 21 wherein said glass layer is deposited on the surface of a Group III–V compound layer.

* * * * *